(12) United States Patent  
Chien et al.

(10) Patent No.: US 8,403,681 B2  
(45) Date of Patent: Mar. 26, 2013

(54) ELECTRICAL CONNECTOR AND ASSEMBLY THEREOF

(75) Inventors: Cheng-Ching Chien, New Taipei (TW); Been-Yang Liaw, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 172 days.

(21) Appl. No.: 13/050,896

(22) Filed: Mar. 17, 2011

(65) Prior Publication Data

US 2011/0230064 A1    Sep. 22, 2011

(30) Foreign Application Priority Data

Mar. 18, 2010   (TW) .................................. 99204718

(51) Int. Cl.  
*H01R 12/00* (2006.01)

(52) U.S. Cl. ............................. 439/66; 439/91; 439/331

(58) Field of Classification Search .................... 439/66, 439/71, 91, 331  
See application file for complete search history.

(56) References Cited

U.S. PATENT DOCUMENTS

| | | | |
|---|---|---|---|
| 7,621,761 B2 * | 11/2009 | Mok et al. ........................ | 439/81 |
| 7,690,932 B2 * | 4/2010 | Nakaone ......................... | 439/91 |
| 7,726,984 B2 * | 6/2010 | Bumb et al. .................... | 439/91 |
| 7,887,336 B2 * | 2/2011 | Nikaido et al. ................. | 439/66 |

* cited by examiner

*Primary Examiner* — Hien Vu  
(74) *Attorney, Agent, or Firm* — Wei Te Chung; Ming Chieh Chang

(57) ABSTRACT

An electrical connector assembly includes an electrical connector, a chip located and a printed circuit board located at opposite sides of the anisotropic conductive film. The electrical connector has an anisoptropic conductive film and a loading mechanism. The anisoptropic conductive film includes an adhesive and a number of conductive particles dispersed in the adhesive. The anisoptropic conductive film has conductivity only in a thicknesswise direction by pressing. The loading mechanism can exert pressure on the anisoptropic conductive film so that the chip and the printed circuit board electrically couples with each other.

12 Claims, 7 Drawing Sheets

ELECTRICAL CONNECTOR AND ASSEMBLY THEREOF

BACKGROUND OF THE INVENTION

1. Field of the Invention

The present invention relates to an electrical connector, especially to an electrical connector for connecting a central process unit with a printed circuit board.

2. Description of Related Art

Central Process Unit (CPU) sockets are used to establish electrical connection between a CPU and a printed circuit board. CPU sockets generally include PGA (Pin Grid Array) type and LGA (Land Grid Array) type according to the contact means of between the CPU and the socket.

Conventional PGA socket comprises a base and a cover sliding on the base. The base and cover each have a plurality of passageways for receiving contacts of socket and pins of the CPU, respectively. A plurality of solder balls are attached to the bottom ends of the contacts for soldering to the printed circuit board. The contacts each have a pair of arms whereby define a bigger space and a smaller space therebetween. The pins of CPU firstly pass though the passageways of the cover and located into the bigger space. Then the cover actuates the pins of the CPU to slide in the base and move into the smaller space. In the bigger space, the pins are separated from the contacts and need not to bear insert force from the contacts. After the pins slide into the smaller space, the pair of arms contact with the pins of the CPU so as to establish electrical connection.

LGA socket includes an insulative housing and a plurality of electrical contacts attached to the housing. Each contact has a contact section projecting out of the insulative housing and extending along a predetermined direction thereby increase the density of the electrical contacts.

As discussed above, traditional CPU sockets all need insulative base or housing and metal contacts. However, it is difficult to reduce the height of the traditional socket to the current manufacture level.

BRIEF SUMMARY OF THE INVENTION

An object of the present invention is to provide a thinner and fine pitch electrical connector.

An electrical connector comprises a base plate with an opening thereon and an anisoptropic conductive film received in the opening of the base plate. The anisoptropic conductive film comprises a pressure sensitive adhesive and a plurality of conductive particles dispersed in the adhesive. The anisoptropic conductive film has conductivity only in a thicknesswise direction at room temperature.

An electrical connector assembly comprises an electrical connector, a chip located and a printed circuit board located at opposite sides of the anisoptropic conductive film. The electrical connector has an anisoptropic conductive film and a loading mechanism. The anisoptropic conductive film includes an adhesive and a plurality of conductive particles dispersed in the adhesive. The anisoptropic conductive film has conductivity only in a thicknesswise direction by pressing. The loading mechanism can exert pressure on the anisoptropic conductive film so that the chip and the printed circuit board electrically couples with each other.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
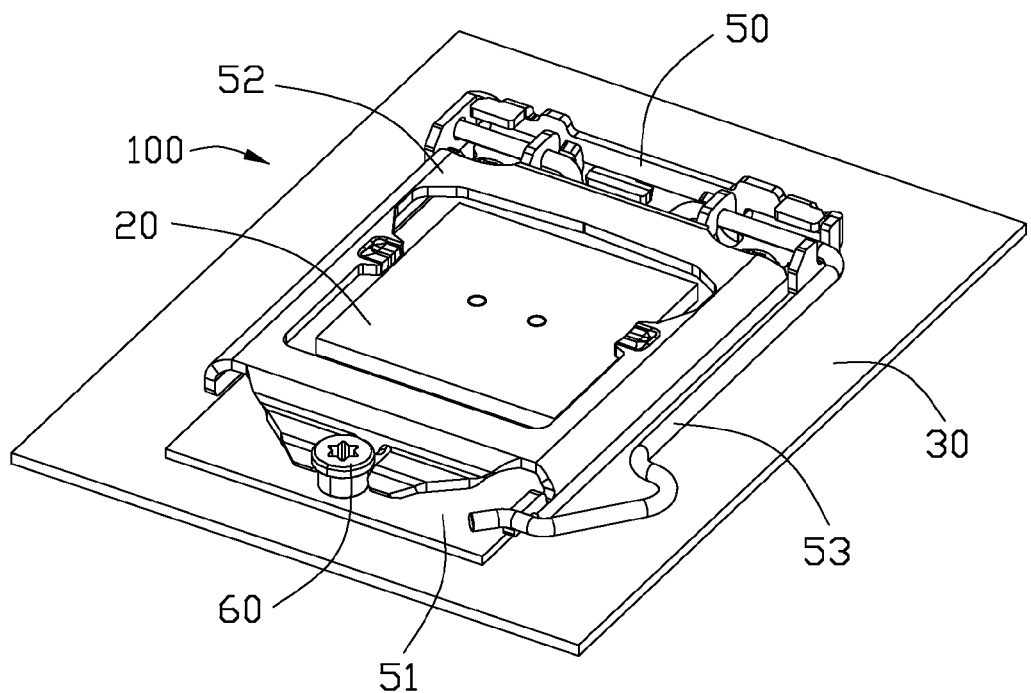
FIG. 1 is an assembled, perspective view of an electrical connector assembly according to a first embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
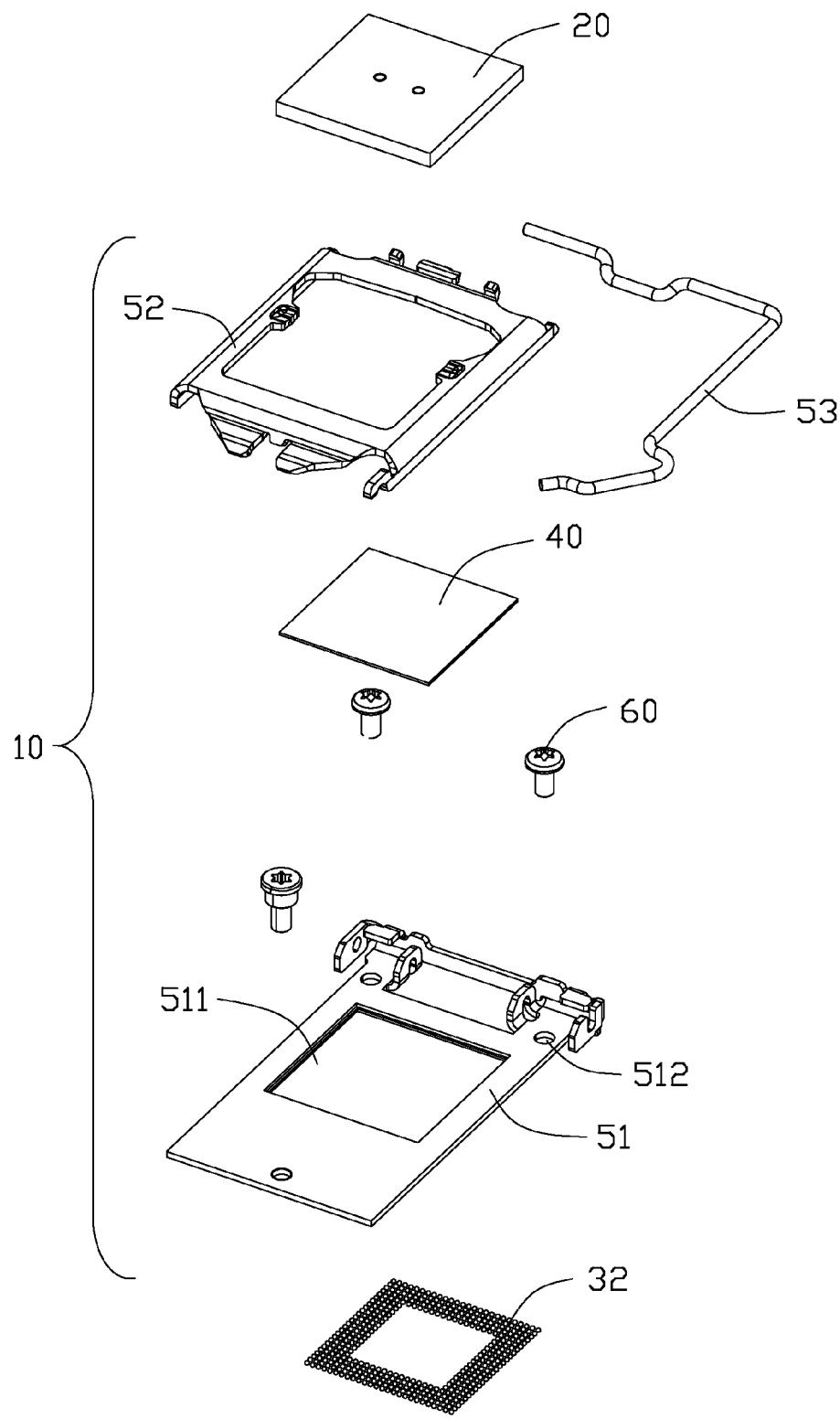
FIG. 2 is an exploded, perspective view of the electrical connector assembly shown in FIG. 1.
Figure 3:
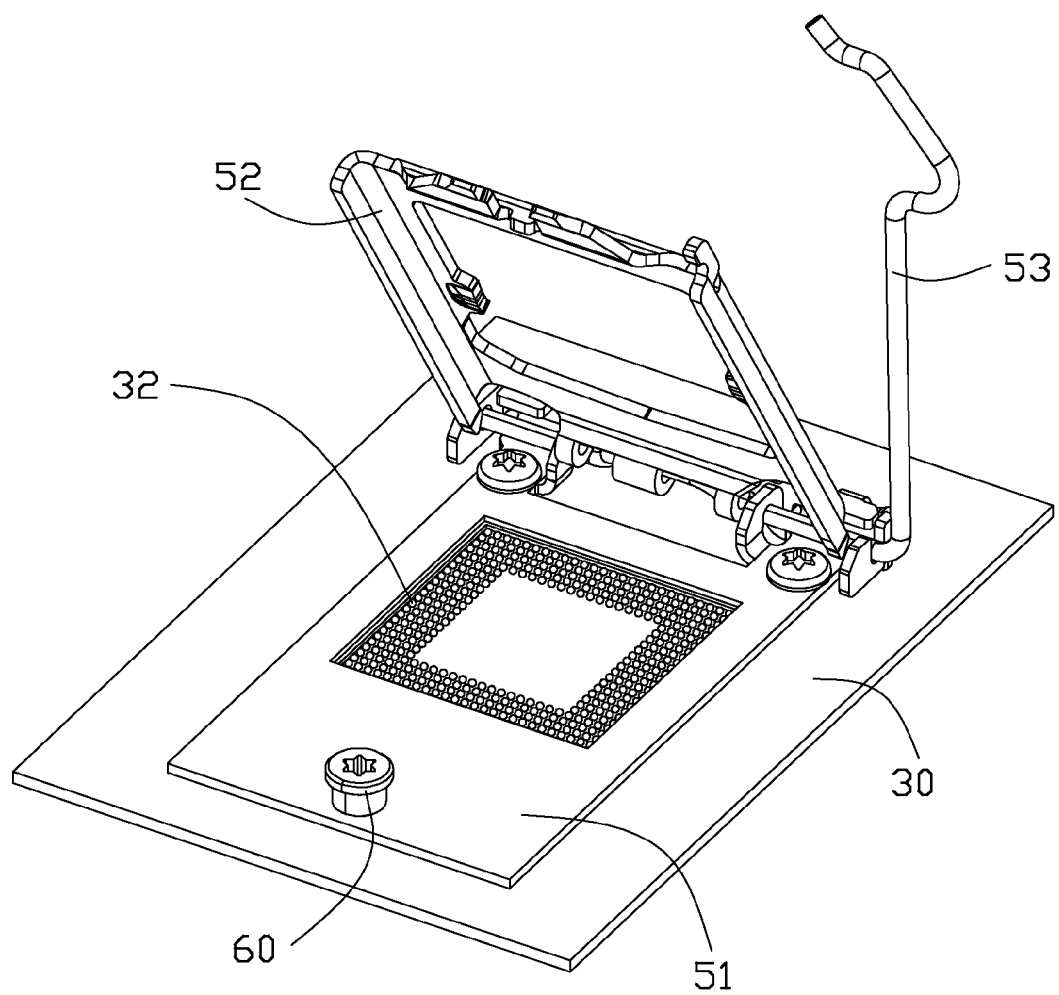
FIG. 3 is an assembled view of the electrical connector assembly shown in FIG. 1 that shows the cover plate thereof is open.

Please referring to FIGS. 1-3, an electrical connector assembly 100 according to a preferred embodiment of the present invention includes an electrical connector 10, a CPU (Central Process Unit) chip 20, and a PCB (Printed Circuit Board) 30. The electrical connector 10 is electrically connected with the CPU chip 20 and the PCB 30 and comprises an anisotropic conductive film 40 and a loading mechanism 50. The CPU chip 20 and the PCB 30 are located at opposite sides of the anisotropic conductive film 40 and contact therewith.

Figure 4:
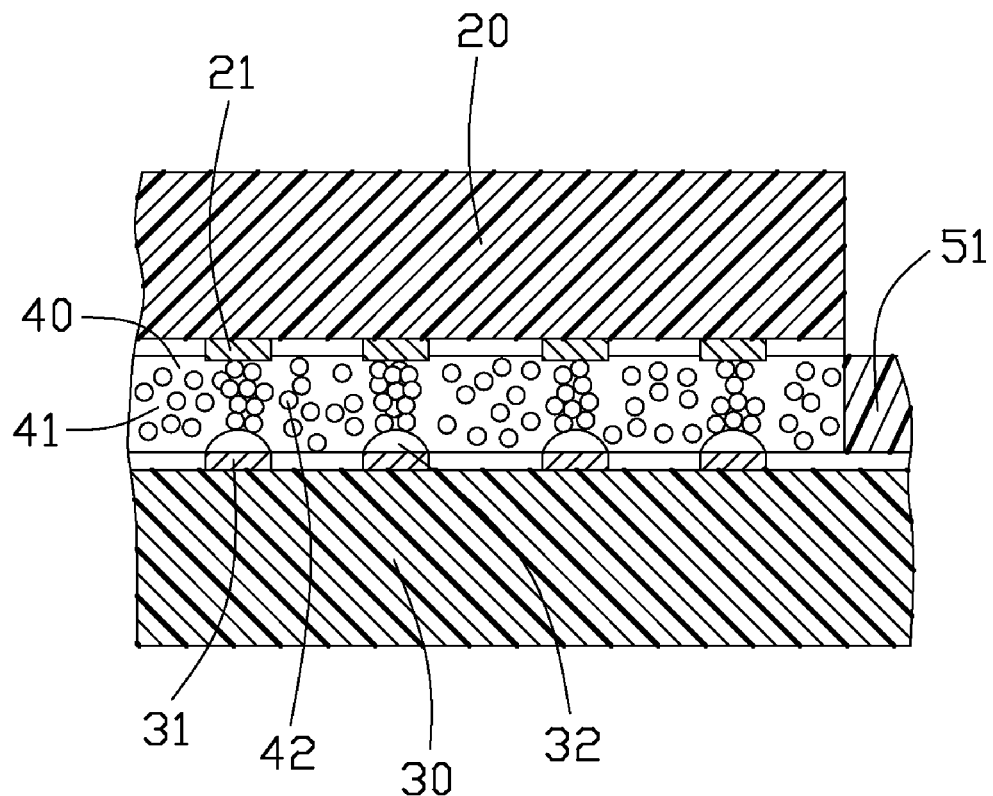
FIG. 4 is a partial cross-sectional view of the electrical connector assembly.
Figure 5:
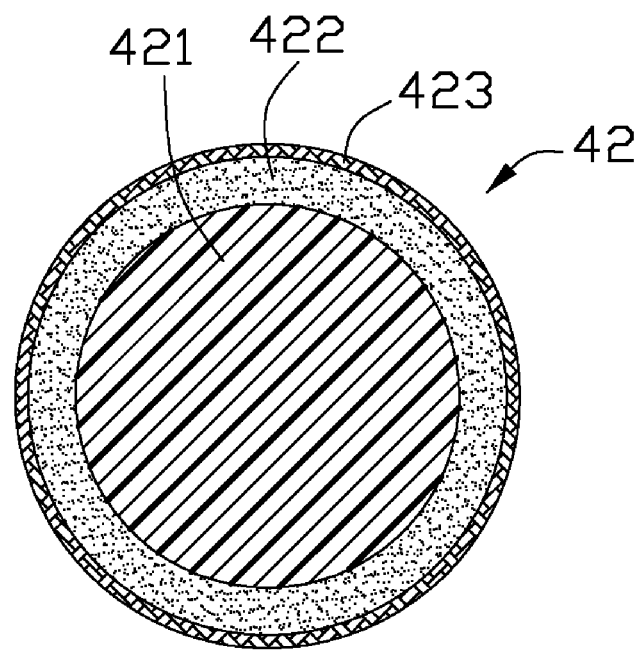
FIG. 5 is a cross-sectional view of a conductive particle in accordance with the first embodiment of the present invention.

As shown in FIGS. 4 to 5, the anisotropic conductive film 40 is obtained by dispersing conductive particles 42 in a pressure sensitive adhesive 41 and forming a film. The adhesive 41 of the present invention is pressure sensitive and can be made of resin, silica gel or rubber et al. The particle 42 comprises a core 421 comprising a resin, a first layer 422 coated over the core 421, and a second layer 423 coated over the first layer 422. The first layer 422 comprises a first conductive material and the second layer 423 comprises a second conductive material different from the first conductive material. The first conductive material is nickel and the second conductive material is gold. The core 421 can be elastically deformable by pressing. Furthermore, the anisoptropic conductive film 40 has conductivity only in a thicknesswise direction thereof and can establish electrically coupling at room temperature between the CPU chip 20 and the PCB 30.

Figure 6:
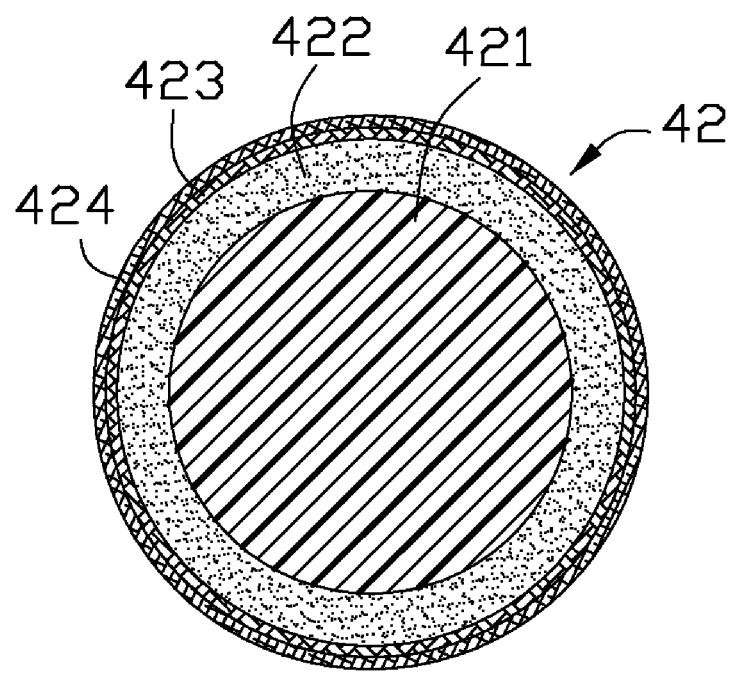
FIG. 6 is a cross-sectional view of a conductive particle in accordance with a second embodiment of the present invention.
Figure 7:
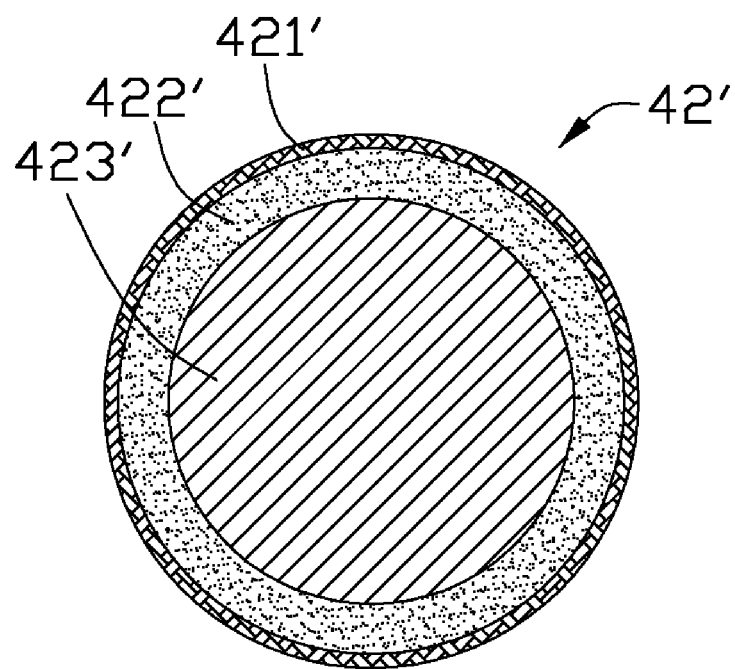
FIG. 7 is a cross-sectional view of a conductive particle in accordance with a third embodiment of the present invention.

Furthermore, please referring to FIG. 6, an insulating layer 424 is coated over the second layer 423 and can be ruptured by the extrusion of adjacent particles 42. As an alternative embodiment, a particle 42' also comprising a core 423' made of copper rather than resin as shown in FIG. 7. A first nickel layer 422' is coated over the core 423' and a second gold layer 421' is coated over the first nickel layer 422.

The particles 42, 42' dispersed in the adhesive 41 is in an amount of 0.3 to 5% by volume. A diameter of each of the conductive particles is 0.05 millimeter to 5 millimeter. A thickness of the anisotropic conductive film 40 is 0.2 millimeter to 0.5 millimeter. These parameters can be selected according different combinations.

Please referring to FIG. 5l to 2, the loading mechanism 50 includes a base plate 51 with a central opening 511 for receiving the anisotropic conductive film 40 and a cover plate 52 attached to the base plate 51 by a load lever 53. The base and cover plates 51, 52 are formed by plating metal plates. The load lever 53 and the cover plate 52 can rotate relative to the base plate 51 between an open position and a closed position. The cover plate also could be secured to the base plate directly. The base plate 51 defines a through hole 512 so that a screw 60 pass therethrough and further secure the base plate 51 to the PCB 30 and fasten the cover plate 52 simultaneously. The base plate 51 also provides position limit for the anisotropic conductive film 40.

FIG. 4 shows the CPU chip 20 includes a plurality of conductive pads 21 protruding from a bottom surface thereof whereby the pads 21 can project into the anisotropic conductive film 40 and contact with the particles 42. The PCB 30 comprises a plurality of conductive wires 31 each soldering to a metal post 32. These metal posts 32 extend into the anisotropic conductive film 40 thereby contacting with the particles 42 thereof. The metal posts 32 are made of tin and height of each post is preferred to 0.2 millimeter to 0.4 millimeter.

In assembling, the metal posts 32 are solder to the conductive wires 31 on the PCB 30. The loading mechanism 50 are attached to the PCB 30 with the metal post 32 projecting into the central opening 511 of the base plate 51. Then, the anisotropic conductive film 40 can be stick on the bottom surface of the CPU chip 20 so that the CPU chip 20 and the anisotropic conductive film 40 can be put into the loading mechanism 50 as a whole. At this time, the anisotropic conductive film 40 is received in the central opening 511. Finally, close the cover plate 52 and further fasten the cover plate 52 by the load lever 53 and the screw 60. The loading mechanism can exert a downward force to the CPU chip 20 whereby the CPU chip 20 is pressed against the anisotropic conductive film 40 and the PCB 30 so that the distance between each pad 21 of the CPU 20 and the corresponding metal post 31 of the PCB 30 is reduced and the CPU chip 20 and the PCB 30 are electrically coupled to each other by the conductive particles 42.

The anisotropic conductive film 40 can reduce the total height of the electrical connector than the traditional sockets. The anisoptropic conductive film 40 of the present invention does not need heating and hardening which also simplify the manufacture of the anisoptropic conductive film 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector socket comprising:
a base plate with an opening extending therethrough in a vertical direction, and
an anisoptropic conductive film received in the opening of the base plate, said anisoptropic conductive film comprising a pressure sensitive adhesive and a plurality of conductive particles dispersed in the adhesive, said anisoptropic conductive film having conductivity only in a thicknesswise direction at room temperature;
wherein the conductive particles each comprises a resin core capable of deformation by pressing, a nickel layer coated over the core, and a gold layer coated over the nickel layer, and wherein the adhesive is made of resin, silica gel or rubber;
wherein the conductive particles dispersed in the adhesive is in an amount of 0.3 to 5% by volume, and wherein a thickness of the anisotropic conductive film is 0.2 millimeter to 0.5 millimeter; and
wherein a cover plate attached to the base plate covering the anisoptropic conductive film and a load lever securing the cover plate to the base plate.

2. The electrical connector as claimed in claim 1, wherein the conductive particles comprises an insulating layer coated over the gold layer and the insulating layer can be ruptured by the extrusion of adjacent particles.

3. The electrical connector as claimed in claim 1, wherein the conductive particles each comprises a copper core, a nickel layer coated over the core, and a gold layer coated over the nickel layer.

4. The electrical connector as claimed in claim 3, wherein a diameter of each of the conductive particles is 0.05 millimeter to 5 millimeter.

5. An electrical connector assembly comprising:
an electrical connector including an anisoptropic conductive film and a loading mechanism, said anisoptropic conductive film comprising an adhesive and a plurality of conductive particles dispersed in the adhesive, said anisotropic conductive film having conductivity only in a thicknesswise direction by pressing;
a chip located on the anisotropic conductive film; and
a printed circuit board located under the anisoptropic conductive film; wherein the loading mechanism can exert pressure on the anisoptropic conductive film thereby establishes electrically coupling between the chip and the printed circuit board
wherein the conductive particles each comprises a resin core capable of deformation by pressing, a nickel layer coated over the core, and a gold layer coated over the nickel layer, and wherein the adhesive is made of resin, silica gel or rubber;
wherein the conductive particles dispersed in the adhesive is in an amount of 0.3 to 5% by volume, and wherein a thickness of the anisotropic conductive film is 0.2 millimeter to 0.5 millimeter; and
wherein the loading mechanism comprises a base plate surrounding the anisotropic conductive film, a cover plate attached to the base plate and a load lever for securing the cover plate to the base plate.

6. The electrical connector assembly as claimed in claim 5, wherein the conductive particles comprises an insulating layer coated over the gold layer, and the insulating layer can be ruptured by the extrusion of adjacent particles.

7. The electrical connector assembly as claimed in claim 5, wherein a diameter of each of the conductive particles is 0.05 millimeter to 5 millimeter.

8. The electrical connector assembly as claimed in claim 5, wherein the cover plate exerts a pressure on the chip and the anisotropic conductive film at a closed position.

9. The electrical connector assembly as claimed in claim 5, wherein the chip includes a plurality of conductive pads which project into the anisotropic conductive film and contact with the particles.

10. The electrical connector assembly as claimed in claim 5, wherein the printed circuit board includes a plurality of conductive wires and a plurality of metal posts soldering to the conductive wires, and wherein the metal posts project into the anisotropic conductive film and contact with the particles.

11. An electrical connector assembly comprising:
  a printed circuit board;
  a base piece secure upon the printed circuit board and defining an opening extending therethrough in a vertical direction;
  an elastic conductive body received in the opening; and
  an electronic package positioned upon the elastic conductive body and downwardly confronting corresponding solder posts on the printed circuit board;
  wherein when the electronic package is located in an upper position with dedicate upward support from the elastic conductive body, said elastic conductive body is essentially in a relaxed manner and no electrical connection is established between the electronic package and the solder posts of the printed circuit board via said elastic conductive body; when the electronic package is urged to be located in a lower position by means of an downward external force, said elastic conductive body is accordingly forcibly compressed in a compressed manner by said electronic package and essentially tightly sandwiched between the electronic package and the printed circuit board, and electrical connection is established between the electronic package and the solder posts of the printed circuit board via said compressed elastic conductive body
  wherein there are plurality of conductive particles each comprising a resin core capable of deformation by pressing a nickel layer coated over the core and embedded in the elastic conductive body and in aligned with the corresponding solder posts in a vertical direction;
  wherein a cover plate and a load lever mounted to the base piece to retain the electronic package in position and apply said downward external force to the electronic package wherein a screw fastens not only the base piece but also the cover plate.

12. The electrical connector assembly as claimed in claim 11, wherein the solder posts essentially upwardly support the elastic conductive body when said elastic conductive body is in said relaxed manner.

* * * * *